United States Patent
Chen

(10) Patent No.: US 8,531,218 B1
(45) Date of Patent: Sep. 10, 2013

(54) FREQUENCY GENERATING SYSTEM

(75) Inventor: Wei-Yung Chen, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 13/443,874

(22) Filed: Apr. 10, 2012

(30) Foreign Application Priority Data

Feb. 23, 2012 (TW) .............................. 101106067 A

(51) Int. Cl.
*H03L 7/06* (2006.01)
(52) U.S. Cl.
USPC .......................................... 327/156; 327/148
(58) Field of Classification Search
None
See application file for complete search history.

(56) References Cited

U.S. PATENT DOCUMENTS

| | | | | |
|---|---|---|---|---|
| 7,164,325 B2* | 1/2007 | Aparin et al. | ................. | 331/176 |
| 7,277,518 B2* | 10/2007 | Loke et al. | ..................... | 375/373 |
| 7,332,972 B2* | 2/2008 | Vandel | .............................. | 331/17 |
| 8,067,965 B2* | 11/2011 | Wei et al. | ....................... | 327/156 |
| 8,125,254 B1* | 2/2012 | Ding | ............................. | 327/156 |
| 2007/0298747 A1* | 12/2007 | Wu | ................................. | 455/260 |
| 2011/0215848 A1* | 9/2011 | Koroglu et al. | ............... | 327/157 |

* cited by examiner

*Primary Examiner* — Cassandra Cox
(74) *Attorney, Agent, or Firm* — Jianq Chyun IP Office

(57) ABSTRACT

A frequency generating system including a phase-locked loop (PLL) and a control signal generation unit is provided. The PLL outputs a phase-locked clock and controls a voltage-controlled oscillator (VCO) therein by using a dual-path architecture. The VCO includes a varactor. The control signal generation unit is coupled to the PLL and disposed in one of the dual paths. The control signal generation unit provides an up voltage, a down voltage, or a middle voltage as a control signal to control the VCO according to an up signal and a down signal of the PLL. The control signal generation unit provides the middle voltage in response to an electrical characteristic of the varactor to compensate the control signal.

9 Claims, 5 Drawing Sheets

| UP | DN | Vctrl-P |
|----|----|---------|
| 0  | 0  | Vmid    |
| 1  | 1  | Vmid    |
| 0  | 1  | Vdn     |
| 1  | 0  | Vup     |

FREQUENCY GENERATING SYSTEM

CROSS-REFERENCE TO RELATED APPLICATION

This application claims the priority benefit of Taiwan application serial no. 101106067, filed on Feb. 23, 2012. The entirety of the above-mentioned patent application is hereby incorporated by reference herein and made a part of this specification.

BACKGROUND

1. Technology Field

The invention generally relates to a signal generating system, and more particularly, to a frequency generating system.

2. Description of Related Art

Frequency generating system plays a very important role in the communication engineering field. Particularly, phase-locked loop (PLL) for generating frequency is broadly adopted in modulation, demodulation, frequency multiplication, frequency synthesis, carrier synchronization, bit synchronization, etc. A PLL is a feedback loop, in which the frequency and phase of an output clock signal are locked at the frequency and phase of an input reference clock signal by using a feedback signal. Thus, in radio communication, if carrier frequency drift occurs during signal transmission, the local oscillation frequency of a receiver can drift along with the carrier frequency drift when a PLL is adopted in the receiver, so that the purpose of phase locking is achieved.

A PLL can be categorized as a PLL with a single-path architecture or a PLL with a dual-path architecture according to the control mechanism adopted by a voltage-controlled oscillator (VCO) inside the PLL. In an application of a high-frequency communication chip, a PLL with the dual-path architecture requires a small layout area. Accordingly, the fabrication cost of the high-frequency communication chip can be effectively reduced. Generally speaking, the capacitance-voltage characteristic curve of a varactor in a VCO of a dual-path PLL may drift when there is process variation or temperature change. This drifting phenomenon makes the frequency gain of the VCO inconsistent to an up signal and a down signal of the PLL. As a result, the up signal and the down signal present an asymmetrical state after they are converted by the VCO. Accordingly, a phase-locked clock generated by the PLL carries spur noise even after it is stabilized. Namely, the signal quality is low.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention is directed to a frequency generating system which can provide a better-quality phase-locked clock.

The invention provides a frequency generating system including a phase-locked loop (PLL) and a control signal generation unit. The PLL outputs a phase-locked clock and controls a voltage-controlled oscillator (VCO) therein by using a dual-path architecture. The VCO includes a varactor. The control signal generation unit is coupled to the PLL and disposed in one of the dual paths. The control signal generation unit provides an up voltage, a down voltage, or a middle voltage as a first control signal to control the VCO according to an up signal and a down signal of the PLL. The control signal generation unit provides the middle voltage in response to an electrical characteristic of the varactor to compensate the first control signal.

As described above, in an exemplary embodiment of the invention, a middle voltage is provided through a control signal generation unit, and the level of the middle voltage is adjusted according to the electrical characteristic of a varactor. Thereby, a phase-locked clock provided by the frequency generating system can effectively reduce spur noise and offers a high signal quality once it is stabilized.

These and other exemplary embodiments, features, aspects, and advantages of the invention will be described and become more apparent from the detailed description of exemplary embodiments when read in conjunction with accompanying drawings.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
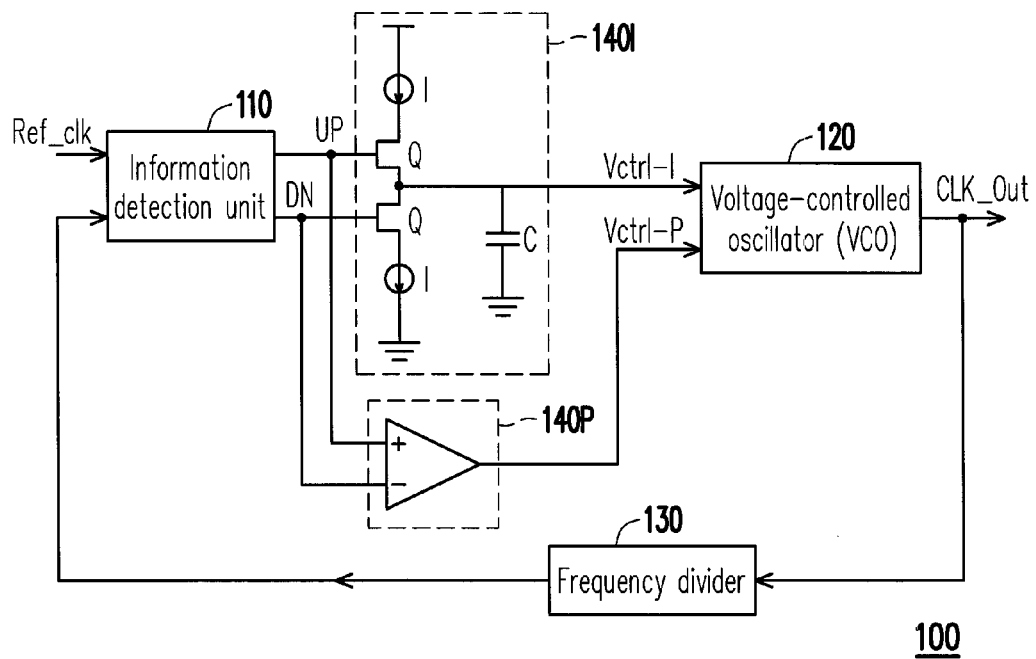
FIG. 1 is a schematic circuit diagram of a phase-locked loop (PLL) with a dual-path architecture.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic circuit diagram of a phase-locked loop (PLL) with a dual-path architecture. Referring to FIG. 1, the PLL system 100 respectively generates control signals Vctrl-I and Vctrl-P to control a voltage-controlled oscillator (VCO) 120 by using dual paths 140I and 140P. In the path 140I, an up signal UP and a down signal DN charge/discharge a capacitor C to increase or decrease the voltage level of the control signal Vctrl-I. In the path 140P, the up signal UP allows the path 140P to generate an up voltage Vup as the control signal Vctrl-P, so as to move the frequency of the VCO 120 towards a higher value. Contrarily, the down signal DN allows the path 140P to generate a down voltage Vdn as the control signal Vctrl-P, so as to move the frequency of the VCO 120 towards a lower value. In addition, when the up signal UP and the down signal DN are in the same state, the path 140P generates a middle voltage Vmid as the control signal Vctrl-P, so as to move the frequency of the VCO 120 towards an intermediate value.

Figure 2:
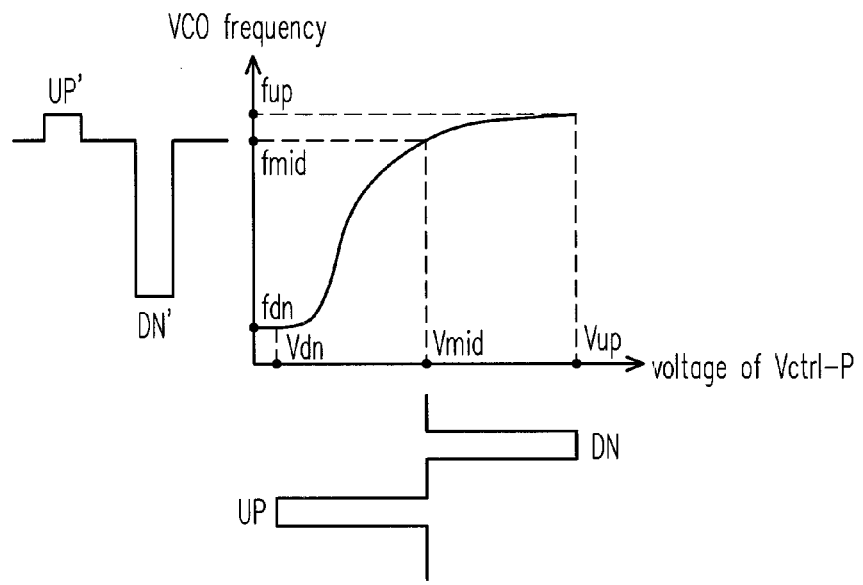
FIG. 2 illustrates a characteristic curve between the frequency of a voltage-controlled oscillator (VCO) and the voltage of a control signal.
Figure 3:
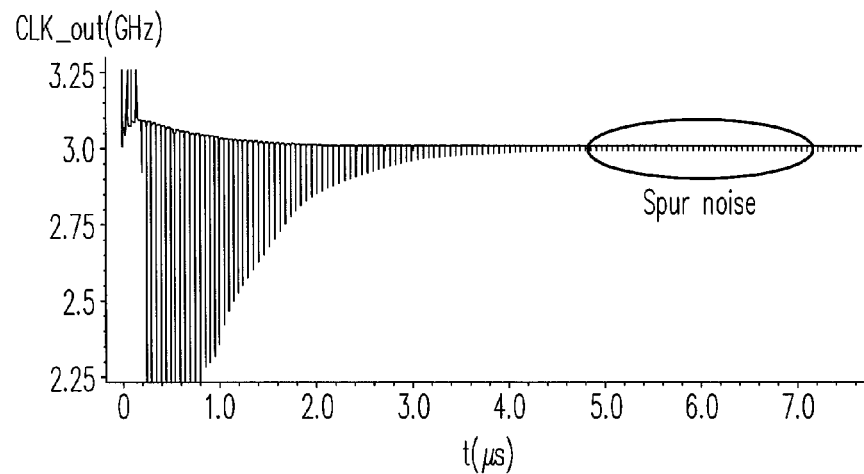
FIG. 3 illustrates a waveform of a phase-locked clock of the PLL in FIG. 1.

The operation described above is conceptually illustrated in FIG. 2. In FIG. 2, the abscissa represents the voltage level of the control signal Vctrl-P, and the ordinate represents the frequency of the VCO 120. Generally speaking, the correspondence between the frequency f of the VCO 120 and the control signal Vctrl-P is not linear. As shown in FIG. 2, this non-linear feature exists because the VCO 120 controls the frequency thereof by using a varactor. Since the capacitance-voltage characteristic curve of the varactor drifts when there is process variation or temperature change, the frequency-voltage characteristic curve of the VCO 120 drifts accordingly. In this case, if the supplied middle voltage Vmid is not adjusted according to the capacitance-voltage characteristic curve therefore is still located between the up voltage Vup and the down voltage Vdn, the frequency gain of the VCO 120 is inconsistent to the up signal UP and the down signal DN and accordingly the up signal UP' and the down signal DN' converted by the VCO 120 present an asymmetrical state, as shown in FIG. 2. As a result, a phase-locked clock CLK_out generated by the PLL system 100 carries spur noise even after it is stabilized (i.e., the signal quality is low), as shown in FIG. 3.

In a frequency generating system provided by an exemplary embodiment of the invention, a middle voltage is provided through a control signal generation unit, and the voltage level of the middle voltage is adjusted in response to the electrical characteristic of a varactor. Thus, a phase-locked clock provided by the frequency generating system carries no or smaller spur noise (i.e., the signal quality is high) after it is stabilized. The frequency generating system includes a PLL system or a clock and data recovery (CDR) circuit. Below, an exemplary embodiment of the invention will be described in detail with reference to accompanying drawings, in which a PLL system is described as an example of the frequency generating system.

Figure 4:
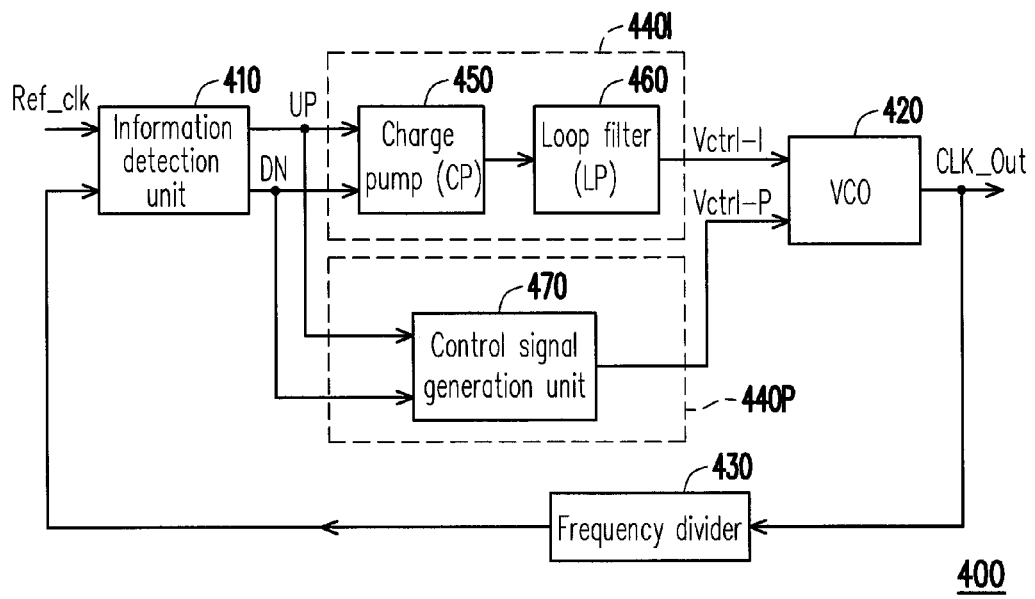
FIG. 4 is a schematic circuit diagram of a PLL with a dual-path architecture according to an embodiment of the invention.

FIG. 4 is a schematic circuit diagram of a PLL with a dual-path architecture according to an embodiment of the invention. Referring to FIG. 4, in the present exemplary embodiment, the frequency generating system 400 includes a PLL and a control signal generation unit 470. The PLL includes an information detection unit 410, a charge pump (CP) 450, a loop filter (LP) 460, a VCO 420, and a frequency divider 430. The PLL outputs a phase-locked clock CLK_out and controls the VCO 420 by using a dual-path architecture. The dual-path architecture includes a first path 440P and a second path 440I. In the present exemplary embodiment, the first path may be a proportional path (i.e., a path passing through the CP 450), the second path may be an integral path (i.e., a path not passing through the CP 450). Additionally, in the present exemplary embodiment, the VCO 420 may be a crystal oscillator, a ring oscillator, or a LC oscillator, and which is fabricated through a metal oxide semiconductor (MOS) transistor fabrication process and includes a varactor (not shown).

To be specific, a PLL has two input terminals respectively for receiving a reference frequency as a reference clock Ref CLK and a feedback frequency. The feedback frequency is a feedback signal of the PLL, and which is usually fed back after being appropriately reduced. The information detection unit 410 received aforementioned two input signals and compares the reference frequency with the feedback frequency to determine the phase differences, the frequency differences, or the phase and frequency differences between the two input signals. When the reference frequency is greater than the feedback frequency, an output terminal of the information detection unit 410 outputs an up signal UP to the first path 440P and the second path 440I. Contrarily, when the reference frequency is smaller than the feedback frequency, another output terminal of the information detection unit 410 outputs a down signal DN.

In the first path 440P, the control signal generation unit 470 is coupled to the PLL and disposed in the first path 440P, and the control signal generation unit 470 provides an up voltage, a down voltage, or a middle voltage, as a first control signal Vctrl-P to control the VCO 420 according to the up signal UP and the down signal DN of the PLL, wherein the up voltage, the down voltage, or the middle voltage may be any value determined by a user. The control signal generation unit 470 provides the middle voltage in response to an electrical characteristic of the varactor. In the present exemplary embodiment, the electrical characteristic may be a capacitance-voltage characteristic curve, a temperature-voltage characteristic curve, or a current-voltage characteristic curve.

In the second path 440I, the information detection unit 410 is a phase detector, and the up signal UP and the down signal DN generated by the information detection unit 410 are used for controlling the CP 450 and the LP 460 to generate a second control signal Vctrl-I, so as to control the VCO 420 on the next level. The VCO 420 generates a clock signal CLK_out according to the first control signal Vctrl-P and the second control signal Vctrl-I and sends the clock signal CLK_out back to the information detection unit 410 to carry out the phase locking operation. However, the frequency of the clock signal CLK_out may need to be appropriately reduced according to the operation frequency of the information detection unit 410 by the frequency divider 430 before it is sent back to the information detection unit 410. Herein the frequency divider 430 can be selectively disposed according to the actual design requirement. The phase locking mechanism is to send the clock signal CLK_out back to the information detection unit 410 to synchronize the phase and frequency of the clock signal CLK_out with those of the reference frequency. The entire phase loop is locked when the feedback frequency and the reference frequency have the same frequency and phase.

Thereby, in the present exemplary embodiment, according to the architecture design of the first path 440P, the middle voltage provided by the control signal generation unit 470 is adjusted in response to the electrical characteristic of the varactor. Even if the capacitance-voltage characteristic curve of the varactor drifts due to process variation or temperature change, the up signal UP and the down signal DN converted by the VCO 420 still present a symmetrical state. Thus, the phase-locked clock generated by the frequency generating system 400 carries no or smaller spur noise after it is stabilized therefore offers a good signal quality.

Figures 5, 6:
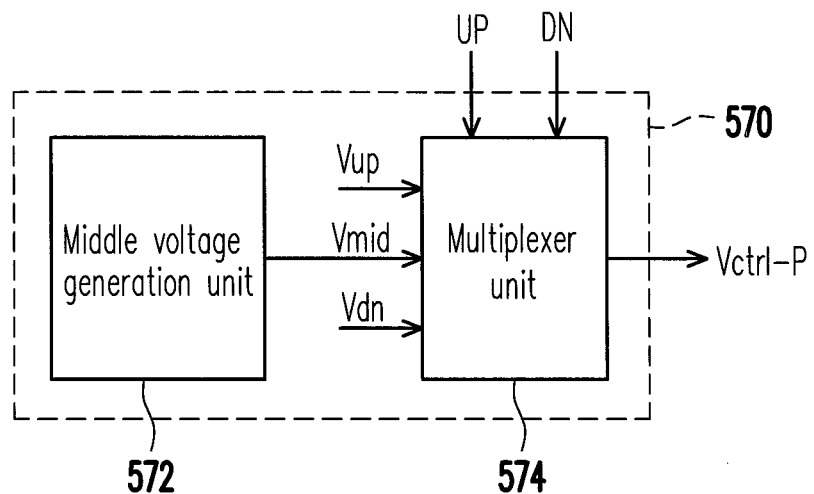
FIG. 5 is an internal schematic block diagram of a control signal generation unit according to an embodiment of the invention.
FIG. 6 illustrates the relationship between states of an up signal and a down signal and a first control signal according to an embodiment of the invention.

FIG. 5 is an internal schematic block diagram of a control signal generation unit according to an embodiment of the invention. Referring to both FIG. 4 and FIG. 5, in the present exemplary embodiment, the control signal generation unit 570 includes a multiplexer unit 574 and a middle voltage generation unit 572. The multiplexer unit 574 provides an up voltage Vup, a down voltage Vdn, or a middle voltage Vmid to the VCO 420 according to an up signal UP and a down signal DN. In the present exemplary embodiment, when the up signal UP and the down signal DN are in different states, the multiplexer unit 574 provides the up voltage Vup or the down voltage Vdn to the VCO 420. Contrarily, when the up signal UP and the down signal DN are in the same state, the multiplexer unit 574 provides the middle voltage Vmid to the VCO 420. FIG. 6 illustrates the relationship between the states of an up signal and a down signal and a first control signal Vctrl-P according to an embodiment of the invention. In the present exemplary embodiment, when the up signal UP is logic 0 and the down signal DN is logic 1, the multiplexer unit 574 provides the down voltage Vdn to the VCO 420 as the first control signal Vctrl-P. When the up signal UP is logic 1 and the down signal DN is logic 0, the multiplexer unit 574 provides the up voltage Vup to the VCO 420 as the first control signal Vctrl-P. When the up signal UP and the down signal DN are in the same state (i.e., are both logic 1 or logic 0), the multiplexer unit 574 provides the middle voltage Vmid to the VCO 420 as the first control signal Vctrl-P. In the present exemplary embodiment, the up voltage Vup is a system voltage of the frequency generating system 400, and the down voltage Vdn is a ground voltage. On the other hand, the middle voltage generation unit 572 is coupled to the multiplexer unit 574 and provides the middle voltage Vmid to the multiplexer unit 574. In the present exemplary embodiment, the middle voltage generation unit 572 provides the middle voltage in response to the electrical characteristic of a varactor inside the VCO 420. Herein the middle voltage is between the system voltage and the ground voltage. The multiplexer unit 574 in the present exemplary embodiment integrates the middle voltage provided by the middle voltage generation unit 572 with the up signal UP or the down signal DN to generate an up voltage and a down voltage. Or, the multiplexer unit 574 outputs the middle voltage only when the up signal UP and the down signal DN are in the same state. In an exemplary embodiment of the invention, the down signal DN may be 0V or 0.1V, the middle voltage is 0.6V, and the up signal UP may be 1V or 1.1V. In other exemplary embodiment of the invention, the voltage level of the down signal DN may be higher than the middle voltage, and the middle voltage may be higher than the voltage level of the up signal UP.

Figure 7:
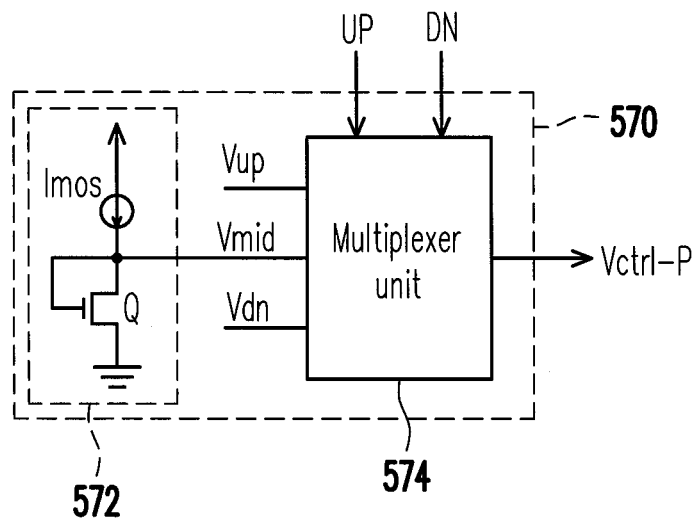
FIG. 7 is an internal schematic circuit diagram of a middle voltage generation unit in FIG. 5 according to an embodiment of the invention.

FIG. 7 is an internal schematic circuit diagram of the middle voltage generation unit in FIG. 5 according to an embodiment of the invention. Referring to FIG. 7, the middle voltage generation unit 572 in the present exemplary embodiment includes a transistor element Q and a bias current source Imos. The transistor element Q has a first terminal, a second terminal, and a control terminal. The first terminal of the transistor element Q is coupled to the control terminal thereof. The bias current source Imos is coupled to the first terminal of the transistor element Q and supplies a bias current to the transistor element Q. In the present embodiment, if the transistor element Q is implemented with a NMOS transistor, the first terminal, second terminal, and control terminal thereof are respectively the drain, source, and gate of the NMOS transistor. However, the implementation of the transistor element Q is not limited to NMOS transistor in the invention. The transistor element Q provides the middle voltage Vmid to the multiplexer unit 574 via the first terminal thereof according to the received bias current.

Figure 8:
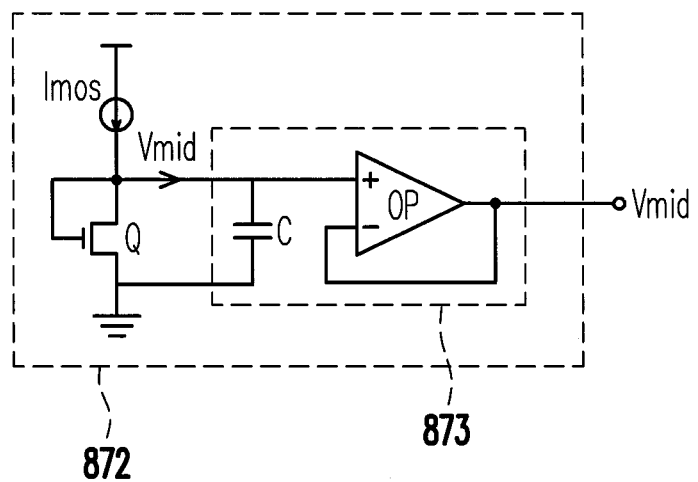
FIG. 8 is an internal schematic circuit diagram of the middle voltage generation unit in FIG. 5 according to another embodiment of the invention.

FIG. 8 is an internal schematic circuit diagram of the middle voltage generation unit in FIG. 5 according to another embodiment of the invention. Referring to FIG. 8, the middle voltage generation unit 872 in the present exemplary embodiment is similar to the middle voltage generation unit 572 illustrated in FIG. 7, and the difference between the two middle voltage generation units is that the middle voltage generation unit 872 further includes a voltage-stabilizing circuit 873. The voltage-stabilizing circuit 873 is coupled to the first terminal of the transistor element Q and receives the middle voltage Vmid. In the present embodiment, the voltage-stabilizing circuit 873 includes a capacitor C and an operational amplifier OP. The capacitor C is connected between the first terminal and the second terminal of the transistor element Q. A non-inverting terminal (+) of the operational amplifier OP is coupled to the first terminal of the transistor element Q, and an inverting terminal (−) of the operational amplifier OP is coupled to an output terminal of the operational amplifier OP. Thus, the middle voltage generation unit 872 provides the stabilized middle voltage Vmid to the multiplexer unit 574 through the voltage-stabilizing circuit 873.

Figure 9:
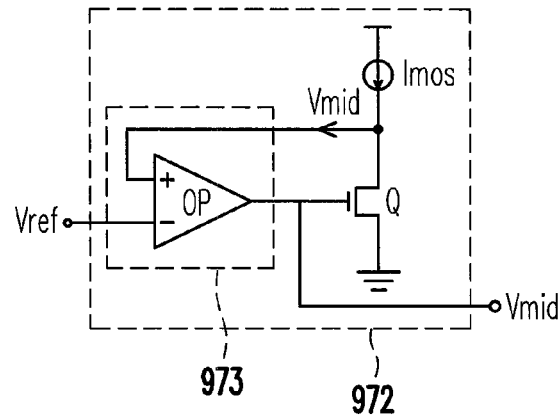
FIG. 9 is an internal schematic circuit diagram of the middle voltage generation unit in FIG. 8 according to another embodiment of the invention.

FIG. 9 is an internal schematic circuit diagram of the middle voltage generation unit in FIG. 8 according to another embodiment of the invention. Referring to FIG. 9, the middle voltage generation unit 972 in the present exemplary embodiment is similar to the middle voltage generation unit 872 in FIG. 8, and the difference between the two middle voltage generation units is that the voltage-stabilizing circuit 973 of the middle voltage generation unit 972 has a design different from that of the voltage-stabilizing circuit 873 in FIG. 8. In the present exemplary embodiment, the voltage-stabilizing circuit 973 only includes an operational amplifier OP. The non-inverting terminal (+) of the operational amplifier OP receives a reference voltage Vref, the inverting terminal (−) thereof is coupled to the first terminal of the transistor element Q, and an output terminal thereof is coupled to the control terminal of the transistor element Q and configured to output the middle voltage Vmid. Thus, the middle voltage generation unit 972 can provide the stabilized middle voltage Vmid to the multiplexer unit 574 through such a design.

Figure 10:
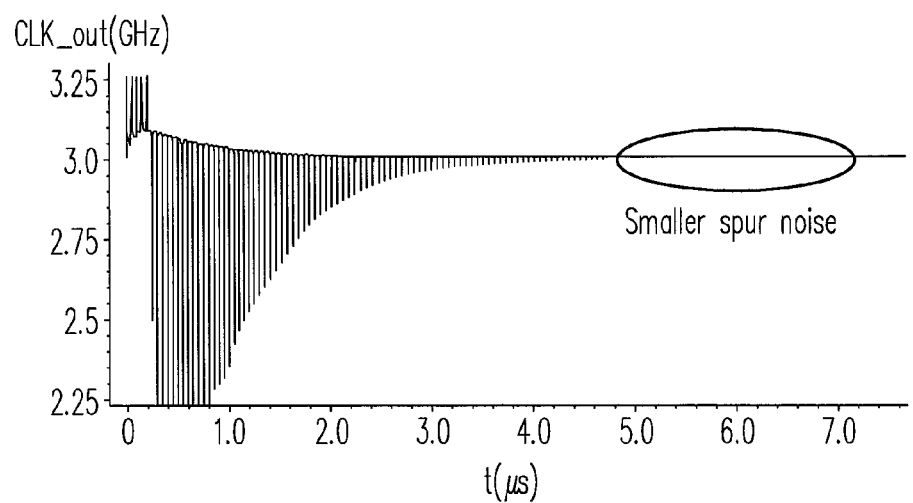
FIG. 10 illustrates a waveform of a phase-locked clock of the PLL in FIG. 4.

In the exemplary embodiments illustrated in FIGS. 7-9, the transistor element Q of each middle voltage generation unit provides the middle voltage Vmid in response to the electrical characteristic of a varactor inside the VCO 420. To be specific, each transistor element Q and the varactor inside the VCO 420 are implemented with MOS transistors of the same type and process. With such a design, even if the capacitance-voltage characteristic curve of the varactor drifts along with process variation or temperature change, the current-voltage characteristic curve of the transistor element Q also changes with the process variation or temperature change. Moreover, the transistor element Q is biased by using the bias current source Imos so that the transistor element Q provides the middle voltage Vmid. The value of the bias current provided by the bias current source Imos is not limited in the invention and can be determined according to actual design requirement, experience rule, or experimental data statistics. Referring to FIG. 2, the middle voltage Vmid is not fixed between the up voltage Vup and the down voltage Vdn. Instead, it is adjusted in response to the electrical characteristic of the varactor. Thus, from this point of view, the middle voltage Vmid in response to the varactor allows the up signal UP' and the down signal DN' converted by the VCO 420 to present a symmetrical state. Accordingly, the phase-locked clock CLK_out provided by the frequency generating system 400 carries no spur noise after it is stabilized therefore offers a good signal quality, as shown in FIG. 10.

As described above, in an exemplary embodiment of the invention, a middle voltage is provided through a control signal generation unit, and the middle voltage is adjusted in response to the electrical characteristic of a varactor. Thus, even if the electrical characteristic of the varactor changes with process variation or temperature change, a phase-locked clock provided by the frequency generating system carries no or smaller spur noise after it is stabilized therefore offers a good signal quality.

The previously described exemplary embodiments of the present invention have many advantages, including reducing the hardware cost of the memory storage apparatus or providing good signal quality to the frequency generating system, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A frequency generating system, comprising:
   a phase-locked loop, outputting a phase-locked clock, and controlling a voltage-controlled oscillator in the phase-locked loop by using a dual-path architecture, wherein the voltage-controlled oscillator comprises a varactor; and
   a control signal generation unit, coupled to the phase-locked loop, disposed in one of the dual paths, and providing an up voltage, a down voltage, or a middle voltage as a first control signal to control the voltage-controlled oscillator according to an up signal and a down signal of the phase-locked loop,
   wherein the control signal generation unit comprises:
      a transistor element, having a first terminal, a second terminal, and a control terminal, wherein the first terminal is coupled to the control terminal, and the second terminal is coupled to a ground voltage; and
      a bias current source, coupled to the first terminal of the transistor element, and providing a bias current to the transistor element,
   wherein the transistor element provides the middle voltage via the first terminal according to the bias current.

2. The frequency generating system according to claim 1, wherein the control signal generation unit comprises:
   a multiplexer unit, selecting one of the up voltage, the down voltage, and the middle voltage, and providing the selected voltage to the voltage-controlled oscillator according to the up signal and the down signal.

3. The frequency generating system according to claim 1, wherein a process of the transistor element is the same with a process of the varactor, an electrical characteristic of the transistor element is changed along with an electrical characteristic of the varactor, and the transistor element provides the middle voltage in response to the electrical characteristic of the varactor.

4. The frequency generating system according to claim 2, wherein the control signal generation unit further comprises:
   a voltage-stabilizing circuit, coupled to the first terminal of the transistor element, and receiving the middle voltage, wherein the transistor element provides the stabilized middle voltage to the multiplexer unit through the voltage-stabilizing circuit.

5. The frequency generating system according to claim 2, wherein when the up signal and the down signal are in different states, the multiplexer unit selects one of the up voltage and the down voltage and provides the selected voltage to the voltage-controlled oscillator.

6. The frequency generating system according to claim 2, wherein when the up signal and the down signal are in a same state, the multiplexer unit provides the middle voltage to the voltage-controlled oscillator.

7. The frequency generating system according to claim 1, wherein the up voltage is a system voltage of the frequency generating system, the down voltage is a ground voltage, and the middle voltage is between the system voltage and the ground voltage.

8. The frequency generating system according to claim 1, wherein the phase-locked loop comprises:
   an information detection unit, receiving a reference clock and a feedback signal, and generating the up signal and the down signal according to the reference clock and the feedback signal;
   a charge pump, coupled to the information detection unit, disposed in the other one of the dual paths, and providing the up voltage or the down voltage as a second control signal to control the voltage-controlled oscillator according to the up signal and the down signal of the phase-locked loop;
   a loop filter, coupled to the charge pump, disposed in the other one of the dual paths, receiving the second control signal, and providing the filtered second control signal to the voltage-controlled oscillator; and
   a frequency divider, coupled to the voltage-controlled oscillator, and outputting the feedback signal to the information detection unit after performing frequency division on the phase-locked clock.

9. The frequency generating system according to claim 8, wherein the voltage-controlled oscillator is coupled to the loop filter, and the voltage-controlled oscillator receives the first control signal and the second control signal and generates the phase-locked clock.

* * * * *